United States Patent
Urakawa

(10) Patent No.: US 7,790,271 B2
(45) Date of Patent: Sep. 7, 2010

(54) DIELECTRIC CERAMIC COMPOSITION, CERAMIC SUBSTRATE, AND METHOD FOR PRODUCING THE SAME

(75) Inventor: Jun Urakawa, Omihachiman (JP)

(73) Assignee: Murata Manufacturing Co., Ltd., Nagaokakyo-shi, Kyoto-fu (JP)

(*) Notice: Subject to any disclaimer, the term of this patent is extended or adjusted under 35 U.S.C. 154(b) by 36 days.

(21) Appl. No.: 12/211,119

(22) Filed: Sep. 16, 2008

(65) Prior Publication Data
US 2009/0004438 A1 Jan. 1, 2009

Related U.S. Application Data

(63) Continuation-in-part of application No. PCT/JP2008/053354, filed on Feb. 27, 2008.

(30) Foreign Application Priority Data
Apr. 9, 2007 (JP) .............................. 2007-101318

(51) Int. Cl.
*B32B 3/00* (2006.01)
(52) U.S. Cl. .................... 428/210; 428/212; 428/318.6; 428/319.1; 428/428; 428/432; 428/450; 428/697; 428/699; 428/701; 174/255; 174/258; 501/32; 501/134; 501/135; 361/762; 361/793
(58) Field of Classification Search ................. 428/210, 428/212, 428, 432, 318.6, 319.1, 450, 697, 428/699, 701; 361/793, 762; 501/32, 134, 501/135; 174/255, 258
See application file for complete search history.

(56) References Cited

U.S. PATENT DOCUMENTS

| | | | | |
|---|---|---|---|---|
| 5,635,301 A | * | 6/1997 | Kondo et al. | 428/426 |
| 6,205,032 B1 | * | 3/2001 | Shepherd | 361/793 |
| 6,503,645 B1 | * | 1/2003 | Taira et al. | 428/699 |

FOREIGN PATENT DOCUMENTS

| | | |
|---|---|---|
| JP | 06-29664 A | 2/1994 |
| JP | 08-175869 A | 7/1996 |
| JP | 2002-137960 A | 5/2002 |
| JP | 2004-149405 A | 5/2004 |
| JP | 2004-345928 A | 12/2004 |

OTHER PUBLICATIONS

Official Communication issued in International Application No. PCT/JP2008/053354, mailed on Jun. 10, 2008.

* cited by examiner

*Primary Examiner*—Cathy Lam
(74) *Attorney, Agent, or Firm*—Dickstein, Shapiro, LLP.

(57) ABSTRACT

A dielectric ceramic composition includes about 10% to about 40% by weight of BaO, about 20% to about 65% by weight of $SiO_2$, about 6% to about 40% by weight of $Al_2O_3$, about 1% to about 15% by weight of $B_2O_3$, about 0.3% to about 3% by weight of $Cr_2O_3$, and about 1% to about 40% by weight of $ZrO_2$. A multilayer ceramic substrate has a laminated structure including an inner layer portion and outer layer portions that have a smaller thermal expansion coefficient than that of the inner layer portion. The use of the dielectric ceramic composition for the outer layer portions enables the ceramic to be resistant to erosion caused by a plating liquid used for plating external conductive films, thus maintaining good adhesiveness between the external conductive films and the outer layer portions.

5 Claims, 1 Drawing Sheet

DIELECTRIC CERAMIC COMPOSITION, CERAMIC SUBSTRATE, AND METHOD FOR PRODUCING THE SAME

BACKGROUND OF THE INVENTION

1. Field of the Invention

The present invention relates to dielectric ceramic compositions, ceramic substrates produced using the dielectric ceramic compositions, and methods for producing the ceramic substrates, and particularly, to improvements of the dielectric compositions to increase the strength of ceramic substrates.

2. Description of the Related Art

A dielectric ceramic composition is disclosed in, for example, Japanese Unexamined Patent Application Publication No. 2002-137960. According to this publication, the composition ratio of a dielectric ceramic composition that can be fired at a relatively low temperature is specified in order to increase the thermal expansion coefficient to increase the mounting reliability and to reduce dielectric loss so as to reduce transmission loss at high frequencies.

However, the dielectric ceramic composition according to Japanese Unexamined Patent Application Publication No. 2002-137960 has a problem in that a ceramic substrate produced using the composition has a low chemical resistance and is eroded when external conductive films formed on the ceramic substrate are plated. This composition also has a problem in that the ceramic substrate can be cracked or broken if the substrate is dropped or due to a temperature change, for example.

SUMMARY OF THE INVENTION

To overcome the problems described above, preferred embodiments of the present invention provide a dielectric ceramic composition, a ceramic substrate produced using the dielectric ceramic composition, and a method for producing the ceramic substrate.

A dielectric ceramic composition according to a preferred embodiment of the present invention preferably includes about 10% to about 40% by weight of BaO, about 20% to about 65% by weight of $SiO_2$, about 6% to about 40% by weight of $Al_2O_3$, about 1% to about 15% by weight of $B_2O_3$, about 0.3% to about 3% by weight of $Cr_2O_3$, and about 1% to about 40% by weight $ZrO_2$, for example.

The dielectric ceramic composition according to preferred embodiments of the present invention preferably further includes about 0.1% to about 3% by weight of at least one of $Y_2O_3$, CaO, MgO, and SrO, for example.

In addition, the dielectric ceramic composition according to preferred embodiments of the present invention preferably includes tetragonal zirconia as a $ZrO_2$-based crystal phase including zirconium after being sintered.

Another preferred embodiment of the present invention provides a ceramic substrate including a dielectric ceramic layer formed by sintering the above-described dielectric ceramic composition according to a preferred embodiment of the present invention.

A ceramic substrate according to a preferred embodiment of the present invention has a laminated structure including outer layer portions and an inner layer portion. The outer layer portions and the inner layer portion include a $SiO_2$-based crystal phase. The content of the $SiO_2$-based crystal phase is less in the outer layer portions than in the inner layer portion so that the outer layer portions have a smaller thermal expansion coefficient than the inner layer portion. In the ceramic substrate according to this preferred embodiment of the present invention, the outer layer portions are formed by sintering the above dielectric ceramic composition according to a preferred embodiment of the present invention.

In the ceramic substrate, the $SiO_2$-based crystal phase is preferably at least one of quartz and cristobalite, for example.

In addition, the outer layer portions and the inner layer portion are preferably made of materials having substantially the same composition except for the content of the $SiO_2$-based crystal phase, for example.

If a conductor pattern is disposed on a surface of and/or inside the ceramic substrate according to preferred embodiments of the present invention, the conductor pattern preferably primarily includes silver or copper.

Another preferred embodiment of the present invention provides a method for producing a ceramic substrate having a laminated structure including outer layer portions having a first thermal expansion coefficient and an inner layer portion having a second thermal expansion coefficient larger than the first thermal expansion coefficient.

The method for producing the ceramic substrate according to this preferred embodiment of the present invention includes the steps of preparing an unfired laminated composite having a laminated structure including unfired outer layer portions and an unfired inner layer portion; and firing the unfired laminated composite.

The unfired outer layer portions and the unfired inner layer portion preferably include at least $SiO_2$, for example. The unfired outer layer portions and the unfired inner layer portion include a material that forms a $SiO_2$-based crystal phase after being fired. The content of the $SiO_2$-based crystal phase after the firing is less in the outer layer portions than in the inner layer portion.

The unfired outer layer portions are made of a dielectric ceramic composition according to preferred embodiments of the present invention.

In the method for producing the ceramic substrate according to a first preferred embodiment of the present invention, the content of $SiO_2$ is less in the unfired outer layer portions than in the unfired inner layer portion. According to a second preferred embodiment, the unfired outer layer portions and the unfired inner layer portion are made of materials having substantially the same composition, and a calcination temperature used to prepare the inorganic material contained in the unfired outer layer portions is greater than that used to prepare the inorganic material contained in the unfired inner layer portion.

The dielectric ceramic composition according to preferred embodiments of the present invention achieves good chemical resistance after being sintered. Accordingly, when external conductive films formed on a ceramic substrate produced using the dielectric ceramic composition are plated, the ceramic is resistant to erosion. As a result, good adhesiveness and adhesion strength are maintained between the external conductive films and the ceramic substrate.

The ceramic substrate produced using the dielectric ceramic composition according to preferred embodiments of the present invention has a greater flexural strength when the dielectric ceramic composition further includes a predetermined amount of at least one of yttrium, calcium, magnesium, and strontium. In this case, the flexural strength is further increased when tetragonal zirconia is contained as a $ZrO_2$-based crystal phase containing zirconium.

When the ceramic substrate according to preferred embodiments of the present invention has a laminated structure including outer layer portions and an inner layer portion, and the outer layer portions are formed by sintering the dielectric ceramic composition, then the problem of ceramic erosion does not substantially occur when external conductive films are formed on the surfaces of the outer layer portions and are plated. Accordingly, good adhesiveness and adhesion strength can be maintained between the external conductive films and the ceramic substrate.

In the ceramic substrate, additionally, the outer layer portions have a smaller thermal expansion coefficient than that of the inner layer portion. This increases the flexural strength of the ceramic substrate because a compressive stress is applied to the outer layer portions through a cooling process after firing, and also because the amount of expansion/contraction of the outer layer portions due to temperature changes is reduced. In this case, the flexural strength of the ceramic substrate is further increased when, as described above, the dielectric ceramic composition used to form the outer layer portions includes a predetermined amount of at least one of yttrium, calcium, magnesium, and strontium.

The dielectric ceramic composition according to preferred embodiments of the present invention includes silicon. Therefore, the thermal expansion coefficient can be easily controlled by adjusting the content of the $SiO_2$-based crystal phase. Because silicon is also included in the inner layer portion, good adhesion can be achieved between the outer layer portions and the inner layer portion.

When the $SiO_2$-based crystal phase is at least one of quartz and cristobalite, the thermal expansion coefficient can be more easily controlled by changing the content of the $SiO_2$-based crystal phase without significantly varying electrical or mechanical properties.

When the outer layer portions and the inner layer portion are made of materials having substantially the same composition, good adhesion can be achieved between the outer layer portions and the inner layer portion, such that the outer layer portions and the inner layer portion are more resistant to defects, such as delamination, for example.

When the conductor pattern of the ceramic substrate according to preferred embodiments of the present invention primarily includes silver or copper, the conductor pattern can be fired simultaneously with the dielectric ceramic composition. This also reduces the electrical resistance of the conductor pattern, thus reducing insertion loss caused by the electrical resistance of the conductor pattern.

In the method for producing the ceramic substrate according to preferred embodiments of the present invention, the content of $SiO_2$ may be less in the unfired outer layer portions than in the unfired inner layer portion, or the calcination temperature used to prepare the inorganic material contained in the unfired outer layer portions may be greater than that used to prepare the inorganic material contained in the unfired inner layer portion. In such a case, the content of the $SiO_2$-based crystal phase after firing can be lower in the outer layer portions than in the inner layer portion so that the outer layer portions can have a smaller thermal expansion coefficient.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
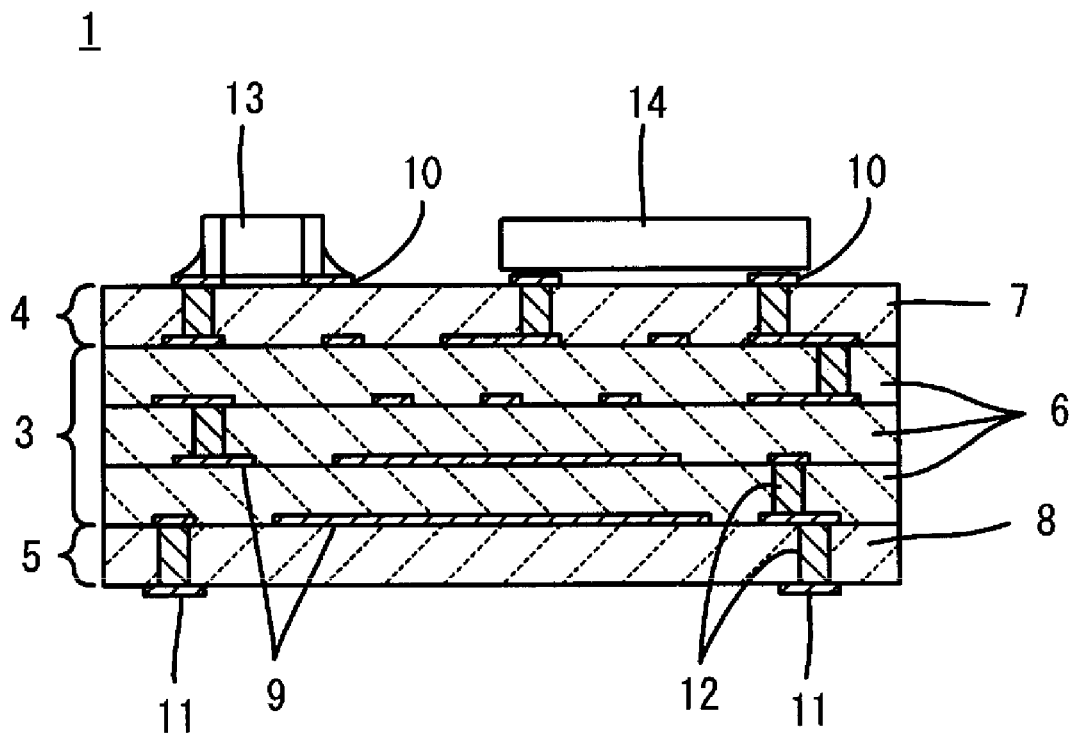
FIG. 1 is a sectional view of a multilayer ceramic substrate according to a preferred embodiment of the present invention produced using a dielectric ceramic composition according to a preferred embodiment of the present invention.

FIG. 1 is a sectional view of a multilayer ceramic substrate 1 according to a preferred embodiment of the present invention.

The multilayer ceramic substrate 1 has a laminated structure including an inner layer portion 3 and first and second outer layer portions 4 and 5 arranged with the inner layer portion 3 disposed therebetween in the lamination direction. The inner layer portion 3 includes at least one inner layer-portion ceramic layer 6. The first outer layer portion 4 includes at least one outer layer-portion ceramic layer 7. The second outer layer portion 5 includes at least one outer layer-portion ceramic layer 8.

The multilayer ceramic substrate 1 includes a conductor pattern that preferably primarily includes silver or copper, for example. The conductor pattern is used, for example, to define passive devices, such as capacitors and inductors, or to provide connection wiring such as electrical connections between devices, for example. The conductor pattern typically includes several conductive films 9 to 11 and several via-hole conductors 12.

The conductive films 9 are arranged inside the multilayer ceramic substrate 1. The conductive films 10 are arranged on one main surface of the multilayer ceramic substrate 1, and the conductive films 11 are arranged on the other main surface. Each via-hole conductor 12 is electrically connected to at least one of the conductive films 9 to 11 and extends through one of the ceramic layers 6 to 8.

Surface-mounted electronic components 13 and 14 are mounted on one main surface of the multilayer ceramic substrate 1 such that they are electrically connected to the external conductive films 10. The external conductive films 11 arranged on the other main surface of the multilayer ceramic substrate 1 provide electrical connection between the multilayer ceramic substrate 1 and a mother board (not shown) on which the multilayer ceramic substrate 1 is mounted.

In the multilayer ceramic substrate 1, the outer layer portions 4 and 5 have a smaller thermal expansion coefficient than the inner layer portion 3. This increases the flexural strength of the multilayer ceramic substrate 1.

In more detail, the outer layer portions 4 and 5 and the inner layer portion 3 are preferably made of non-glass ceramic materials and includes a $SiO_2$-based crystal phase such as, for example, quartz and/or cristobalite. The content of the $SiO_2$-based crystal phase is less in the outer layer portions 4 and 5 than in the inner layer portion 3, so that the outer layer portions 4 and 5 have a smaller thermal expansion coefficient than the inner layer portion 3.

The outer layer portions 4 and 5 and the inner layer portion 3 are preferably made of materials having substantially the same composition except for the content of the $SiO_2$-based crystal phase, for example. This provides good adhesion between the outer layer portions 4 and 5 and the inner layer portion 3, so that they are resistant to defects, such as delamination, for example.

The outer layer portions 4 and 5 and the inner layer portion 3 are preferably made of materials having substantially the same composition. The phrase "substantially the same composition" refers to compositions that allow one or more, and preferably, two or more, identical crystal phases to be provided in addition to the $SiO_2$-based crystal phase.

More specifically, the outer layer portions 4 and 5 are made of a dielectric ceramic composition according to preferred embodiments of the present invention. The dielectric ceramic composition preferably includes, for example, about 10% to about 40% by weight of BaO, about 20% to about 65% by weight of $SiO_2$, about 6% to about 40% by weight of $Al_2O_3$, about 1% to about 15% by weight of $B_2O_3$, about 0.3% to about 3% by weight of $Cr_2O_3$, and about 1% to about 40% by weight of $ZrO_2$.

If the BaO content is less than about 10% by weight or greater than about 40% by weight, the dielectric ceramic composition has poor sinterability. If the $SiO_2$ content is less than about 20% by weight, the dielectric ceramic composition has low chemical resistance. If the $SiO_2$ content is greater than about 65% by weight, on the other hand, the dielectric ceramic composition has poor sinterability. If the $Al_2O_3$ content is less than about 6% by weight, the dielectric ceramic composition has low flexural strength after being sintered. If the $Al_2O_3$ content is greater than about 40% by weight, on the other hand, the dielectric ceramic composition has poor sinterability. If the $B_2O_3$ content is less than about 1% by weight, the dielectric ceramic composition has poor sinterability. If the $B_2O_3$ content is greater than about 15% by weight, on the other hand, the dielectric ceramic composition has low flexural strength after being sintered.

Chromium suppresses the flow of a glass phase to prevent the glass from floating on the surfaces of the external conductive films 10 and 11, to ensure good platability and solderability. If the $Cr_2O_3$ content is less than about 0.3% by weight, however, the advantage described above cannot be achieved. If the $Cr_2O_3$ content is greater than about 3% by weight, on the other hand, the solderability is deteriorated.

Zirconium, which plays the very important role in preferred embodiments of the present invention, improves the chemical resistance of the dielectric ceramic composition after the composition is sintered. This enables the ceramic of the outer layer portions 4 and 5 to be resistant to erosion during plating of the external conductive films 10 and 11, so as to maintain good adhesiveness and adhesion strength between the external conductive films 10 and 11 and the outer layer portions 4 and 5. If the $ZrO_2$ content is less than about 1% by weight, the advantage described above cannot be sufficiently achieved. If the $ZrO_2$ content is greater than about 40% by weight, on the other hand, the dielectric ceramic composition has poor sinterability.

The dielectric ceramic composition according to this preferred embodiment of the present invention preferably further includes about 0.1% to about 3% by weight of at least one of $Y_2O_3$, CaO, MgO, and SrO, for example. This increases the flexural strength of the dielectric ceramic composition after the composition is sintered. In this case, the increased flexural strength appears more significantly if the sintered composition includes tetragonal zirconia as a $ZrO_2$-based crystal phase including zirconium.

In the multilayer ceramic substrate 1, as described above, the outer layer portions 4 and 5 have a smaller thermal expansion coefficient than the inner layer portion 3. This increases the flexural strength because a compressive stress is applied to the outer layer portions 4 and 5 due to a cooling process after firing and because the amount of extension/contraction of the outer layer portions 4 and 5 due to temperature changes is reduced. The increased flexural strength can be improved if, as described above, the dielectric ceramic composition defining the outer layer portions 4 and 5 includes a predetermined amount of at least one of yttrium, calcium, magnesium, and strontium.

To achieve the increased flexural strength more reliably, preferably, the inner layer portion 3 of the multilayer ceramic substrate 1 has a thickness of about 50 μm to about 1,500 μm, and the outer layer portions 4 and 5 each have a thickness of about 5 μm to about 150 μm, for example.

A stress resulting from the difference in thermal expansion coefficient acts on the interfaces between the outer layer portions 4 and 5 and the inner layer portion 3. In more detail, a compressive stress acts on the outer layer portions 4 and 5. The compressive stress decreases with increasing distance from the interfaces. A tensile stress, on the other hand, acts on the inner layer portion 3. The tensile stress decreases with increasing distance from the interfaces. This is because such stresses are relieved with distance. If the distance exceeds about 150 μm, for example, substantially no compressive stress acts on the surfaces. Thus, each of the outer layer portions 4 and 5 preferably has a thickness of about 150 μm or less, for example.

If each of the outer layer portions 4 and 5 has a thickness of less than about 5 μm, on the other hand, the inner layer portion 3, whose strength has been decreased by the tensile stress, lies in near-surface regions that is less than about 5 μm from the surfaces. Thus, the inner layer portion 3 can be easily broken near the surfaces and the advantages provided by applying a compressive stress to the outer layer portions 4 and 5 is no longer provided. Thus, each of the outer layer portions 4 and 5 preferably has a thickness of at least about 5 μm.

The dielectric ceramic composition used for the inner layer portion 3, as described above, preferably has substantially the same composition as the outer layer portions 4 and 5. In this case, if the inner layer portion 3 includes a material that forms a $SiO_2$-based crystal phase after being fired, the composition of the dielectric ceramic composition used for the inner layer portion 3 is selected so that the content of the $SiO_2$-based crystal phase after the firing is less in the outer layer portions 4 and 5 than in the inner layer portion 3.

The dielectric ceramic composition according to this preferred embodiment has a relatively high dielectric constant because it includes a relatively large amount of zirconium. Accordingly, if the dielectric ceramic composition is used for a ceramic substrate in high-frequency applications, its characteristics may be deteriorated. For the multilayer ceramic substrate 1 shown in FIG. 1, therefore, the dielectric ceramic composition according to this preferred embodiment of the present invention is used only for the outer layer portions 4 and 5, and a dielectric ceramic composition including no or very little zirconium is used for the inner layer portion 3. Preferably, a dielectric ceramic composition including substantially no zirconium except for impurities is used for the inner layer portion 3, for example. This prevents the deterioration of the characteristics when the substrate 1 is used in high-frequency applications.

The multilayer ceramic substrate 1 is preferably produced as follows.

Figure 2:
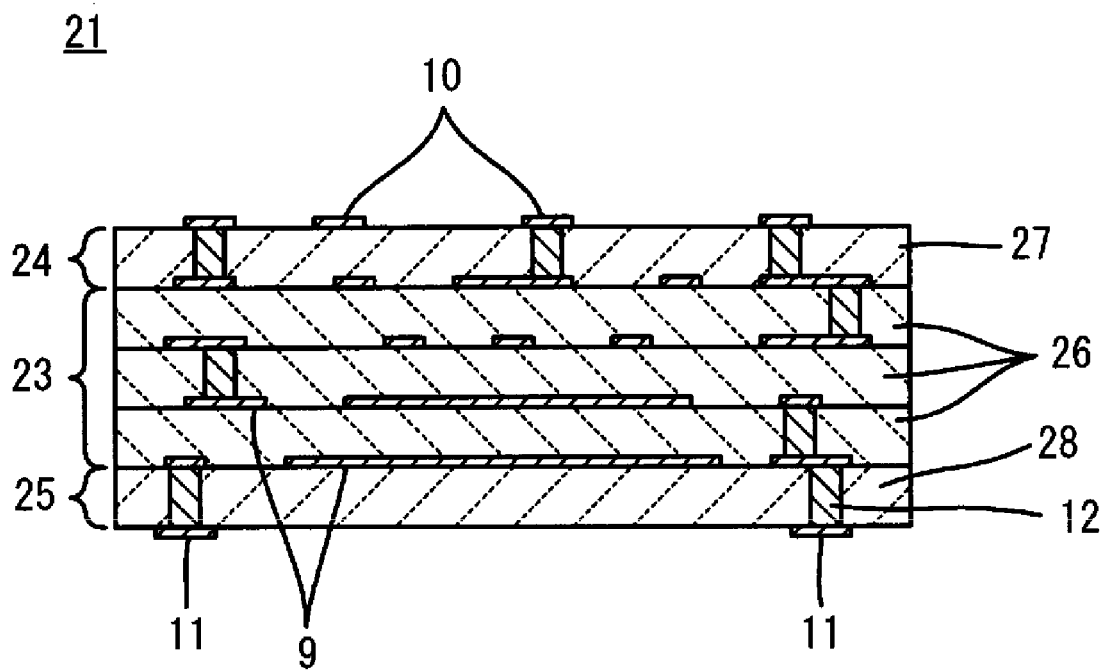
FIG. 2 is a sectional view of an unfired laminated composite prepared during the production of the multilayer ceramic substrate shown in FIG. 1.

To produce the multilayer ceramic substrate 1, an unfired laminated composite 21 as shown in FIG. 2 is prepared. The unfired laminated composite 21, which is to be the multilayer ceramic substrate 1 after firing, includes an unfired inner layer portion 23 corresponding to the inner layer portion 3 of the multilayer ceramic substrate 1 and unfired first and second outer layer portions 24 and 25 corresponding to the first and second outer layer portions 4 and 5, respectively.

The unfired outer layer portions 24 and 25 are made of the dielectric ceramic composition according to a preferred embodiment of the present invention. The unfired inner layer portion 23, as described above, is preferably made of a material having substantially the same composition as the material of the unfired outer layer portions 24 and 25.

If the unfired inner layer portion 23 includes a material that forms a $SiO_2$-based crystal phase after being fired, the respective compositions of the outer layer portions 24 and 15 and the inner layer portion 23 are preferably selected so that the content of the $SiO_2$-based crystal phase after the firing is less in the outer layer portions 4 and 5 than in the inner layer portion 3, for example.

To achieve the above-described relationship for the content of the $SiO_2$-based crystal phase, according to a first preferred embodiment of the present invention, the content of $SiO_2$ is less in the unfired outer layer portions 24 and 25 than in the unfired inner layer portion 23. According to a second preferred embodiment of the present invention, the unfired outer layer portions 24 and 25 and the unfired inner layer portion 23 are made of materials having substantially the same composition, and the calcination temperature used to prepare the inorganic material included in the unfired outer layer portions 24 and 25 is greater than that used to prepare the inorganic material included in the unfired inner layer portion 23.

The unfired inner layer portion 23 includes inner layer-portion ceramic green sheets 26 defining the inner layer-portion ceramic layers 6. The unfired outer layer portion 24 includes an outer layer-portion ceramic green sheet 27 defining the outer layer-portion ceramic layer 7. The unfired outer layer portion 25 includes an outer layer-portion ceramic green sheet 28 defining the outer layer-portion ceramic layer 8. To prepare the unfired laminated composite 21, the inner layer-portion ceramic green sheets 26 and the outer layer-portion ceramic green sheets 27 and 28 are preferably prepared, laminated in a predetermined order, and pressed together, for example. Alternatively, the unfired laminated composite 21 may be prepared by forming green ceramic layers corresponding to the ceramic green sheets 26 to 28 by thick-film printing.

The inner layer-portion ceramic green sheets 26 and the outer layer-portion ceramic green sheets 27 and 28 include the conductive films 9 to 11 and the via-hole conductors 12.

Next, the unfired laminated composite 21 is fired. Copper, for example, is used as the conductive constituent of the conductive films 9 to 11 and the via-hole conductors 12. The unfired inner layer portion 23 and the unfired outer layer portions 24 and 25 are preferably fired at about 950° C. to about 1,040° C. in a reducing atmosphere, for example. As a result of the firing, the multilayer ceramic substrate 1 shown in FIG. 1 is produced.

A constraining green sheet may be prepared which includes an inorganic material, such as $Al_2O_3$, for example, that does not substantially sinter at the temperature at which the unfired inner layer portion 23 and the unfired outer layer portions 24 and 25 are sintered, and the firing step may be performed with the constraining green sheet laminated on at least one main surface of the unfired laminated composite 21. In this case, the constraining green sheet does not contract because it does not substantially sinter in the firing step. The constraining green sheet functions to prevent contraction of the unfired laminated composite 21 in the main surface direction. This prevents undesirable deformation of the resulting multilayer ceramic substrate 1, so as to have improved dimensional accuracy and so as to be resistant to delamination between the unfired outer layer portions 24 and 25 and the unfired inner layer portion 23 during the firing.

In addition to the multilayer ceramic substrate 1 having the laminated structure described above, the dielectric ceramic composition according to preferred embodiments of the present invention may be applied to a ceramic substrate having a monolayer structure including only one dielectric ceramic layer.

Next, an experimental example produced to examine the advantages of preferred embodiments of the present invention will be described.

First, powders of $SiO_2$, $BaCO_3$, $Al_2O_3$, $B_2O_3$, $Cr_2O_3$, and $ZrO_2$, defining the major components of the dielectric ceramic composition, and powders of $Y_2O_3$, $CaCO_3$, $MgCO_3$, and $SrCO_3$, defining the trace components, were prepared. These powders were weighed out and mixed according to the compositions shown in Table 1 on the basis of the respective oxides and were calcined at about 800° C. to about 1,000° C. The resultant calcined powders were pulverized in a zirconia ball mill for about 12 hours to prepare material powders.

Next, the material powders were mixed with an organic solvent including toluene and Ekinen and then with a binder and a plasticizer to prepare slurries. The slurries were formed into ceramic green sheets with a thickness of 50 about μm using a doctor blade.

Next, the ceramic green sheets were laminated, cut to an appropriate size, and fired at about 950° C. to about 1,040° C. in a reducing atmosphere.

The sintered laminates, obtained after the firing, according to the respective samples were evaluated for the properties shown in Table 1.

In Table 1, the item "Sintering" shows whether or not sufficient sintering was achieved in the firing step, where "Good" denotes that sufficient sintering was achieved, and "Poor" denotes that sufficient sintering was not achieved under the firing conditions described above.

The item "$\varepsilon_r$" shows the dielectric constants ($\varepsilon_r$) of the sintered laminates of the respective samples. The dielectric constant ($\varepsilon_r$) were determined measuring their capacitances at a frequency of about 1 MHz.

The item "Flexural strength" shows the flexural strengths of the sintered laminates of the respective samples. The flexural strengths were measured using a three-point bending strength test.

The item "Adhesion strength" shows the adhesion strengths of the sintered laminates of the respective samples. The adhesion strengths were measured by forming conductive films on surfaces of the sintered laminates, plating the conductive films with nickel and gold, soldering L-shaped wires to the conductive films, and removing the L-shaped wires from the sintered laminates. The conductive films were formed by applying a conductive paste including copper as a conductive component to the surfaces of the sintered laminates over an area of about 2 mm×about 2 mm and firing the paste.

The item "Amount of dissolution" shows the analysis results of the amounts of ceramic components dissolved in the nickel plating liquid used for the nickel plating. In the item "Amount of dissolution", "ND" denotes that the amount of dissolution was so small that it was not detectable.

The samples determined to be "Poor" in the item "Sintering" were not evaluated for the items "$\varepsilon_r$", "Flexural strength", "Adhesion strength", and "Amount of dissolution".

TABLE 1

| Sample No. | Composition (% by weight) | | | | | | | Sintering | $\epsilon_r$ (1 MHz) | Flexural strength (MPa) | Adhesion strength (N) | Amount of dissolution (µg) |
| --- | --- | --- | --- | --- | --- | --- | --- | --- | --- | --- | --- | --- |
| | $Al_2O_3$ | $SiO_2$ | BaO | $B_2O_3$ | $ZrO_2$ | $Cr_2O_3$ | Trace component | | | | | |
| 1* | 13.0 | 54.0 | 29.0 | 3.0 | 0.0 | 1.0 | — | Good | 6.2 | 230 | 22 | 150 |
| 2* | 13.0 | 53.5 | 29.0 | 3.0 | 0.5 | 1.0 | — | Good | 6.3 | 230 | 24 | 56 |
| 3 | 13.0 | 52.9 | 29.0 | 3.0 | 1.0 | 1.0 | Y:0.1 | Good | 6.7 | 270 | 30 | 14 |
| 4 | 18.0 | 48.0 | 27.8 | 3.0 | 2.0 | 1.0 | Y:0.2 | Good | 6.9 | 270 | 32 | 6 |
| 5 | 11.0 | 49.0 | 25.0 | 3.0 | 10.0 | 1.0 | Ca:1.0 | Good | 7.4 | 310 | 33 | ND |
| 6 | 20.0 | 39.5 | 24.0 | 5.0 | 10.0 | 1.0 | Y:0.5 | Good | 7.6 | 310 | 35 | ND |
| 7 | 12.0 | 43.0 | 22.0 | 3.0 | 16.0 | 3.0 | Ca:1.0 | Good | 8.1 | 310 | 34 | 3 |
| 8 | 19.0 | 34.0 | 21.0 | 3.0 | 20.0 | 1.0 | Y:1.0/Mg:1.0 | Good | 8.3 | 330 | 33 | ND |
| 9 | 9.0 | 36.0 | 20.0 | 3.0 | 30.0 | 1.0 | Mg:1.0 | Good | 8.8 | 320 | 34 | ND |
| 10 | 8.0 | 28.0 | 17.0 | 3.0 | 40.0 | 1.0 | Y:0.5/Ca:2.5 | Good | 9.4 | 350 | 32 | 2 |
| 11* | 5.0 | 23.0 | 15.0 | 2.0 | 50.0 | 1.0 | Y:4.0 | Poor | — | — | — | — |
| 12 | 13.0 | 34.0 | 24.0 | 3.0 | 20.0 | 1.0 | Ca:5.0 | Good | 8.2 | 200 | 27 | ND |
| 13 | 6.0 | 49.5 | 30.0 | 3.0 | 10.0 | 1.0 | Ca:0.5 | Good | 7.2 | 270 | 29 | ND |
| 14 | 28.0 | 20.0 | 32.0 | 3.0 | 15.0 | 1.0 | Y:0.5/Ca:0.5 | Good | 8.1 | 300 | 27 | 18 |
| 15 | 11.0 | 47.5 | 29.0 | 1.0 | 10.0 | 1.0 | Sr:0.5 | Good | 7.0 | 300 | 31 | ND |
| 16* | 11.0 | 42.0 | 35.0 | 0.5 | 10.0 | 1.0 | Y:0.5 | Poor | — | — | — | — |
| 17 | 40.0 | 28.0 | 16.5 | 10.0 | 5.0 | 0.3 | Sr:0.2 | Good | 7.8 | 260 | 29 | ND |
| 18 | 8.0 | 65.0 | 11.5 | 10.0 | 5.0 | 0.3 | Y:0.2 | Good | 5.8 | 270 | 30 | ND |
| 19* | 44.0 | 23.0 | 18.0 | 9.0 | 5.0 | 0.5 | Ca:0.5 | Poor | — | — | — | — |
| 20* | 15.0 | 18.0 | 37.0 | 12.0 | 16.0 | 0.5 | Ca:1.5 | Good | 9.1 | 200 | 15 | 82 |
| 21* | 7.0 | 70.0 | 12.3 | 6.0 | 3.0 | 1.5 | Y:0.2 | Poor | — | — | — | — |
| 22* | 4.0 | 43.8 | 38.0 | 10.0 | 3.0 | 1.0 | Ca:0.2 | Good | 7.0 | 180 | 17 | 65 |
| 23 | 12.0 | 30.0 | 31.5 | 15.0 | 10.0 | 1.0 | Ca:0.5 | Good | 7.6 | 300 | 29 | ND |
| 24* | 13.0 | 31.7 | 24.0 | 20.0 | 10.0 | 1.0 | Mg:0.3 | Good | 7.3 | 160 | 22 | ND |
| 25 | 22.0 | 44.0 | 10.0 | 10.0 | 12.5 | 2.0 | Y:0.5 | Good | 7.4 | 290 | 32 | ND |
| 26 | 11.0 | 33.0 | 40.0 | 6.0 | 8.0 | 0.8 | Ca:0.2 | Good | 7.7 | 290 | 30 | ND |
| 27* | 10.0 | 24.0 | 46.0 | 8.0 | 10.0 | 1.5 | Ca:0.5 | Poor | — | — | — | — |
| 28 | 13.0 | 47.0 | 24.0 | 5.0 | 10.0 | 1.0 | — | Good | 7.3 | 220 | 31 | ND |

In Table 1, the samples marked with asterisks are outside of the scope of the present invention.

Referring to Table 1, the samples within the scope of the present invention achieved good sintering and relatively high flexural strengths and adhesion strengths for the conductive films, and the amounts of ceramic components dissolved in the plating liquid were so small that they were not detectable or only negligibly detectable.

In particular, Samples 3 to 10, 13 to 15, 17, 18, 23, 25, and 26 had greater flexural strengths because the content of $ZrO_2$ was about 1% to about 40% by weight, and at least one of the trace components, namely, $Y_2O_3$, CaO, MgO, and SrO, was included in an amount of about 0.1% to about 3% by weight.

According to an examination of Samples 5 to 10 by XRD, tetragonal zirconia was detected as a crystal phase. Samples 5 to 10, including tetragonal zirconia, had flexural strengths greater than about 300 MPa. For Sample 28, on the other hand, which did not include a trace component, monoclinic zirconia was detected by XRD. The monoclinic zirconia had a relatively low flexural strength. Sample 12, which included more than about 3% by weight of a trace component, had a relatively low flexural strength.

For Samples 1 and 2, which were outside the scope of the present invention because the content of $ZrO_2$ was less than about 1% by weight, a large amount of ceramic components dissolved in the plating liquid, and the adhesion strengths of the conductive films were relatively low, particularly, less than about 25 N. Sample 11, on the other hand, had poor sinterability because the content of $ZrO_2$ was greater than about 40% by weight.

Sample 27 had poor sinterability because the content of BaO was greater than about 40% by weight. Such poor sinterability will also result if the content of BaO is less than about of 10% by weight, although no sample is shown in Table 1.

For Sample 20, in which the content of $SiO_2$ was less than about 20% by weight, a large amount of ceramic components dissolved in the plating liquid, and the adhesion strengths of the conductive films were relatively low, particularly, less than about 25 N. Sample 21, on the other hand, had poor sinterability because the content of $SiO_2$ was greater than about 65% by weight.

Sample 22 had a relatively low flexural strength, particularly, less than about 200 MPa, because the content of $Al_2O_3$ was less than about 6% by weight. Sample 19, on the other hand, had poor sinterability because the content of $Al_2O_3$ was greater than about 40% by weight.

Sample 16 had poor sinterability because the content of $B_2O_3$ was less than about 1% by weight. Sample 24, on the other hand, had low flexural strength because the content of $B_2O_3$ was greater than about 15% by weight.

The content of $Cr_2O_3$ is about 0.3% to about 3% by weight according to preferred embodiments of the present invention. All samples shown in Table 1 were within this range. $Cr_2O_3$ functions to suppress the flow of a glass phase to reduce glass floating on the surfaces of the conductive films, thus improving platability and solderability. Accordingly, defective plating or soldering may result if the content of $Cr_2O_3$ is less than about 0.3% by weight. If the content of $Cr_2O_3$ is greater than about 3% by weight, on the other hand, solderability may be deteriorated.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic substrate having a laminated structure comprising:
    outer layer portions and an inner layer portion, the outer layer portions and the inner layer portion including a $SiO_2$-based crystal phase, a content of the $SiO_2$-based crystal phase being less in the outer layer portions than in the inner layer portion so that the outer layer portions have a smaller thermal expansion coefficient than the inner layer portion; wherein
    the outer layer portion includes a dielectric ceramic composition comprising about 10% to about 40% by weight of BaO, about 20% to about 65% by weight of $SiO_2$, about 6% to about 40% by weight of $Al_2O_3$, about 1% to about 15% by weight of $B_2O_3$, about 0.3% to about 3% by weight of $Cr_2O_3$, and about 1% to about 40% by weight of $ZrO_2$, the dielectric ceramic composition being sintered; and
    the inner layer portion is made of materials having substantially the same composition as materials of the outer layer portions except for the content of the $SiO_2$-based crystal phase, and the inner layer portion includes substantially no zirconium.

2. The ceramic substrate according to claim 1, wherein the dielectric ceramic composition further comprising about 0.1% to about 3% by weight of at least one of $Y_2O_3$, CaO, MgO, and SrO.

3. The ceramic substrate according to claim 1, wherein the dielectric ceramic composition includes tetragonal zirconia as a $ZrO_2$-based crystal phase including zirconium.

4. The ceramic substrate according to claim 1, wherein the $SiO_2$-based crystal phase is at least one of quartz and cristobalite.

5. The ceramic substrate according to claim 1, wherein a conductor pattern primarily including one of silver and copper is disposed on at least one of a surface of the ceramic substrate and inside the ceramic substrate.

* * * * *